United States Patent [19]

Hughes

[11] Patent Number: 4,494,084
[45] Date of Patent: Jan. 15, 1985

[54] PIN DIODE LINEAR ATTENUATOR CONTROLLED BY A COMPANDING DAC

[75] Inventor: Richard S. Hughes, Ridgecrest, Calif.

[73] Assignee: The United States of America as represented by the Secretary of the Navy, Washington, D.C.

[21] Appl. No.: 353,752

[22] Filed: Mar. 1, 1982

[51] Int. Cl.³ .......................................... H03H 11/24
[52] U.S. Cl. .................................. 333/81 R; 307/540; 307/564
[58] Field of Search ............... 333/81 R, 81 A, 14, 333/17 L; 307/540, 565, 561, 551, 555, 553, 564

[56] References Cited

U.S. PATENT DOCUMENTS

| | | | |
|---|---|---|---|
| 3,529,266 | 9/1970 | King | 333/81 |
| 3,568,073 | 3/1971 | McGuffin | 307/565 X |
| 3,765,020 | 10/1973 | Seager et al. | 333/81 |
| 3,846,724 | 11/1974 | Maier | 333/81 |
| 4,019,160 | 4/1977 | Kam | 333/81 |
| 4,196,381 | 4/1980 | Standing | 323/23 |
| 4,216,445 | 8/1980 | Abajian | 333/81 |
| 4,224,583 | 9/1980 | Larkin | 333/100 |
| 4,236,126 | 11/1980 | Weller et al. | 333/81 R |
| 4,300,108 | 11/1981 | Shuck et al. | 333/81 R |

OTHER PUBLICATIONS

Dowe, Brian, "Recent Op Amp Developments" New Electronics, vol. 13, No. 12 (Jun. 10, 1980), pp. 96–100.

*Primary Examiner*—Paul Gensler
*Assistant Examiner*—Benny T. Lee
*Attorney, Agent, or Firm*—Robert F. Beers; W. Thom Skeer

[57] ABSTRACT

A companding digital to analog converter (DAC) of a digital input and exponential output is utilized to drive a PIN diode having a logarithmic attenuation characteristic. An RF signal applied to the diode is linearly attenuated by the diode and variably controlled by digital means through the DAC.

1 Claim, 2 Drawing Figures

PIN DIODE LINEAR ATTENUATOR CONTROLLED BY A COMPANDING DAC

BACKGROUND OF THE INVENTION

1. Field of the Invention

This invention addresses the field of electronics. More particularly, this invention lies in the region of solid state devices. More specifically, this invention relates to variable resistance solid state devices that can effect a variable, linear attenuation of radio frequency (RF) signals. More exactly, this invention describes a circuit of a digitally controlled, exponential driving means for a logarithmic attenuating means to effect a linear attenuation of an RF signal. More specifically, but not necessarily limited thereto, this invention utilizes a companding digital to analog converter (DAC), which has characteristics of a digital input and exponential analog output, to drive, by means of a current source, a PIN diode. A PIN diode has characteristics of a variable resistor and logarithmic attenuator for attenuation of RF signals. The combination of the companding DAC and PIN diode effects a linear attenuation of an RF signal controlled by digital means.

Diodes, PIN diodes, and DAC's are well known and utilized in the art. The unique application of the invention disclosed herein requires a comprehensive understanding of diode characteristics.

Since the variable RF attenuation is dependent on the variable resistance of the PIN diode, it is worthwhile at this point to review the key properties of PIN diodes.

The most important feature of the PIN diode is its inherent ability to act as a current controlled resistor at Radio Frequencies. Most diodes possess this capability to some degree, but the PIN diode is especially optimized in design to achieve a wide resistance range with consistantly good logarithmic linearity and low distortion. In a typical application, as the control current is varied continuously from one microampere to 100 milliamperes, the resistance of a PIN diode will change from over ten thousand ohms to about one ohm. This characteristic variation of resistance with current makes the PIN diode ideally suited for attenuator applications.

The PIN diode is similar to ordinary P-N junction diodes except for an added intrinsic region (I-layer) sandwiched between the P and N layers.

The I-layer is merely a layer of ordinary semiconductor material (Silicon or Germanium), having all impurities removed. The nature of semiconductors is such that even very small amounts of certain impurities drastically alter their electrical properties. In an intrinsic semiconductor, the Si or Ge atoms each have four valence electrons in their outer orbits which conveniently form a covalent bond with four adjacent, similar atoms, leaving no free electrons for conduction of current through the lattice structure and hence indicating a strong resistance (resistivity).

The P type layer, is formed by adding a dopent impurity, such as B, Ga or In, having three valence electrons, to the intrinsic semiconductor. Said dopent also desires to have four valence electrons for covalent bonding, and in taking (accepting) one from an adjacent Si atom, it leaves a positive hole in the Si atom; i.e. the positive protons of the Si atom now out number the negative electrons by one. Said positive hole (a majority carrier) then migrates (conducts current) from one Si atom to another.

The N type layer is formed by adding a dopent impurity, such as Sb, As or P, having five valence electrons, to the intrinsic semiconductor. Said dopent also desires to have four valence electrons for covalent bonding, and in giving (donating) one to an adjacent Si atom, it creates a free negative electron (majority carrier). Said negative electron then migrates (conducts current) from one Si atom to another.

Thermal generation of additional free electrons and accompanying holes tends to cause minority carriers in the P and N layers; i.e. in the P layer holes are majority carriers and electrons minority carriers, and in the N layer electrons are majority carriers and holes minority carriers.

It is in the I layer that the control of minority carriers is enhanced. The resistance and large width of the intrinsic layer results in a high breakdown voltage and low capacitance. When a forward bias (negative terminal applied to the N layer and positive terminal to the P layer) is applied to the P and N layers, the injection of minority carriers into the intrinsic region increases the conductivity of the I layer. The forward bias forces negative electrons (majority carriers) from the N layer into the I layer (the space charge region of a normal P-N junction) which become minority carriers therein. The bias also forces positive holes (majority carriers) from the P layer into the I layer which also become minority carriers therein. The time in which said minority carriers take to combine indicate their lifetime. At RF, the minority carrier lifetime is long enough to conduct current, and depending on their concentration (bias) a variable resistance appears rather than rectification.

It should be apparent that a reverse bias will inject few if any minority carriers into the I layer and thereby indicates a substantial resistance barrier.

Above a limiting frequency the PIN diode acts as a pure resistance. This RF resistance is controlled by varying the forward bias which varies the amount of minority carriers in the I layer.

Below a limiting frequency, rectification occurs as in an ordinary PN diode. In the vicinity of the limiting frequency, there is some rectification in the resulting distortion. The amount of distortion is dependent on the bias current, the RF power, the frequency, and the minority carrier lifetimes.

To completely understand the application of a companding DAC to the present invention in combination with a PIN diode to drive said diode it is important to understand how the companding curve is generated.

Reference is hereby made to incorporate herein an article entitled *Data Conversion With Companding DAC Devices* published February 1978 by Advanced Micro Devices which gives a thorough in depth explanation of companding DAC's.

Generally, the companding curve output is a piecewise linear approximation of an exponential characteristic. Each segment of the curve is a chord and each segment or chord consists of several steps wherein the size of each step doubles as the chord number increases which in effect gives an exponential output current.

2. Description of the Prior Art

It is known that there are many applications for attenuator circuits. One example of such an application for such a circuit is a modulator wherein an RF input signal is selectively attenuated as a function of a control or modulating DC current to provide amplitude modulation.

It has been known that certain components such as for example, PIN diodes, can exhibit the properties of a variable resistor at microwave frequencies which are too high for rectification to take place because of the relatively large recovery time (minority carrier lifetime) of a fixed I (intrinsically doped) layer. As mentioned earlier, at zero or reverse bias, the I layer introduces a high resistance. Under forward bias, however, the injection and storage of carriers reduces the resistance of the I region.

Some prior art attenuators have been designed using this knowledge with such components as PIN diodes and field effect transistors to accomplish RF attenuation which is a function of the direct current (DC) bias current through the components. Such circuits have also frequently utilized a constant DC source to control the DC bias.

These previous applications of a PIN diode have described a "linear" attenuation of an RF signal in response to a DC control current that is substantially "linear" over a wide dynamic range. The linear feature in all prior art, however, in fact refers to a logarithmic linearity in response to a linear DC control current. In fact the primary performance problem of PIN diode attenuators has been variable-gain nonlinearity.

In addition, all prior art dealing with an attenuation of an RF signal describes an analog input/output control. Today, we live in a digital world. Modern electronic systems are replacing many of the analog signal processing and transmissions functions with digital data processing. The use of digital electronics can lead to improvements in system cost, performance, accuracy and reliability. Digital systems can transmit many signals on the same line in a multiplexed mode and do not suffer from the same kind of noise and crosstalk problems that are inherent in analog systems.

Therefore it is substantially more desirable to be able to control RF attenuation linearly by digital means than by analog means as was customary in the past.

Prior to the invention disclosed herein one could with substantially more components, equipment and expense control an RF attenuation by digital means, as follows: on receiving a digital input control signal, an "exponential look up table" would be referenced to determine a respective analog voltage from a DAC that would cause a specific resistance (attenuation) in the PIN diode. This system though effective for its intended purposes was cumbersome, costly and extensive in the use of components and time.

Thus, there is a continuing need in the state of the art for an uncomplicated linear attenuator circuit that is digitally controlled.

SUMMARY OF THE INVENTION

This invention is an electronic circuit that conveniently and efficiently obtains a variable linear attenuation of an RF signal controlled by digital means. A companding DAC having a digital input and exponential analog output is used to drive a PIN diode whose variable resistance characteristic is used to attenuate an RF signal. A PIN diode attenuation is logarithmetically linear; however, when exponentially driven by the companding DAC, the attenuation is linear with respect to the digital input. The companding DAC circuit's exponential current output characteristic combines with the PIN diode's logarithmic attenuation characteristic to produce a linearized variable attenuator.

OBJECT OF THE INVENTION

It is an object of this invention to provide a digitally controlled variable, linear attenuation of an RF signal.

It is a further object to solve the primary performance problem of a PIN diode—that of variable-gain nonlinearity—by using a companding DAC based driver circuit to linearize a PIN diode's attenuation of an RF signal.

Still another object is to provide means for other applications such as a variable gain amplifier or automatic gain control (AGC) tracking loop which call for a linearly variable attenuation that is conveniently and economically effected utilizing the concept of this invention.

Yet another object is to provide a linear attenuation device that is convenient and economical to produce.

These and other objectives, features and advantages of the described invention will become more apparent upon reading the following detailed description of the preferred embodiments and referring to the accompanying drawings.

DESCRIPTION OF THE PREFERRED EMBODIMENT

Figure 1:
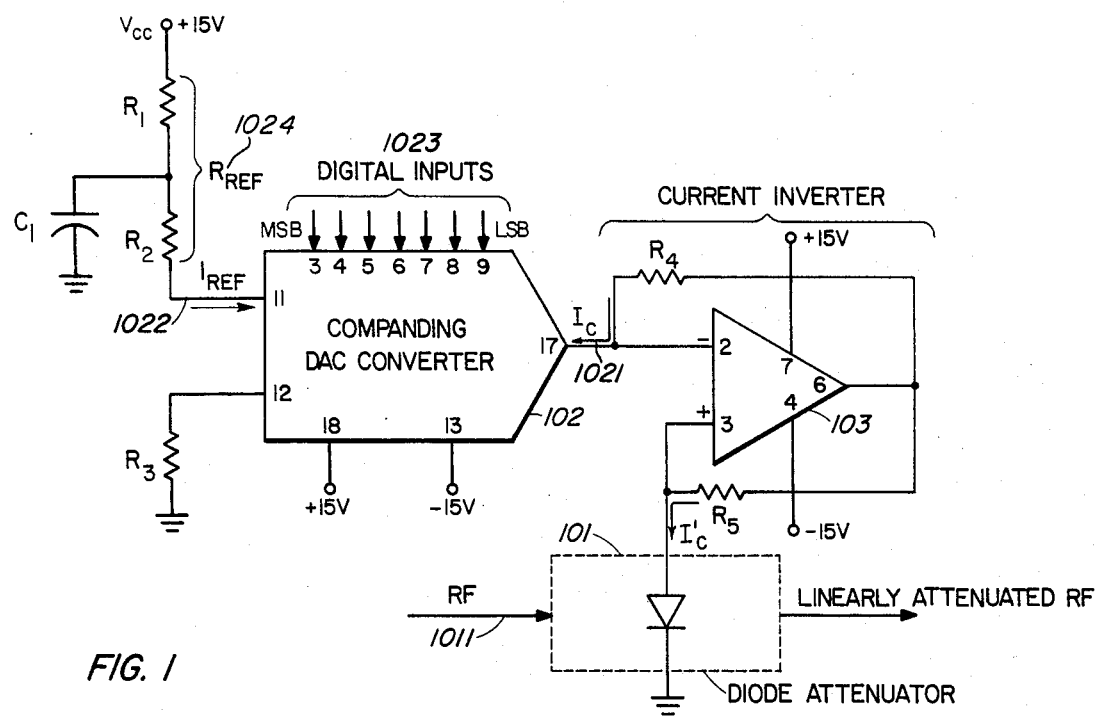
FIG. 1 illustrates a composite schematic layout of the described circuit.

Referring to FIG. 1, a companding DAC, 102, is coupled by means of a current inverter operational amplifier, 103, to a PIN diode attenuator, 101.

DAC, 102, is controlled by digital inputs, 1023, on pins 3, 4, 5, 6, 7, 8 and 9, and is provided with a bias current on pins 13 and 18, and a reference current, $I_{REF}$ on pin 11. $R_{REF}$ equals the sum of $R_1$ and $R_2$ and is approximately equal to $R_3$; $R_1$ and $R_2$ are grounded through capacitor $C_1$ (0.1 μF) to filter noise. $R_{REF}$ is dependent on desired input current, $I_c$, at pin 17 of DAC, 102. Current $I_c$ flows in the direction of the arrow at pin 17 of DAC 102, shown in FIG. 1, and thus pin 17 may be considered a current sink as is well known in the art.

Op amp 103 is provided with a bias voltage on pins 4 and 7, and has an output at pin 6, part of which flows through $R_4$ to pin 17 of DAC 102 and part of which flows through $R_5$ to PIN Diode 101. Pins 2 and 3 of op amp 103 are inputs, pin 2 being an inverting or negative input and pin 3 being a noninverting or positive input. $R_4$ is equal to $R_5$ which equals 1 Kohm, 1% tolerance.

PIN Diode, 101, is controlled (provided a bias current $I_c'$) through resistor $R_5$ by pin 6 of Op Amp 103 and provides a linear attenuation of Radio Frequency (RF) signal, 1011, fed through diode, 101.

Additionally, driving a PIN diode from a current source in this manner provides excellent temperature stability.

Again referring to FIG. 1, companding Digital to Analog Converter (DAC), 102, enables the necessary exponential current ($I_c$) to flow through pin 17. To provide proper current interfacing, operational amplifier (op amp) 103 couples converter, 102, to diode, 101.

DAC, 102, pins 3 to 9 accept digital control signals. For simplicity, only five of the seven bits are used (bits 3, 4, 5, 6, 7); taking point-to-point data for $2^7$ bits requires too much time in this circuit design. Pins 8 and 9 are held at "ONE". Pin 11 serves as DAC, 102, linear or reference-current input and determines the maximum output control current when pins 3 to 9 are all at "ONE".

DAC, 102, in the present configuration is a Precision Monolithic DAC-76, but is not necessarily limited thereto.

Figure 2:
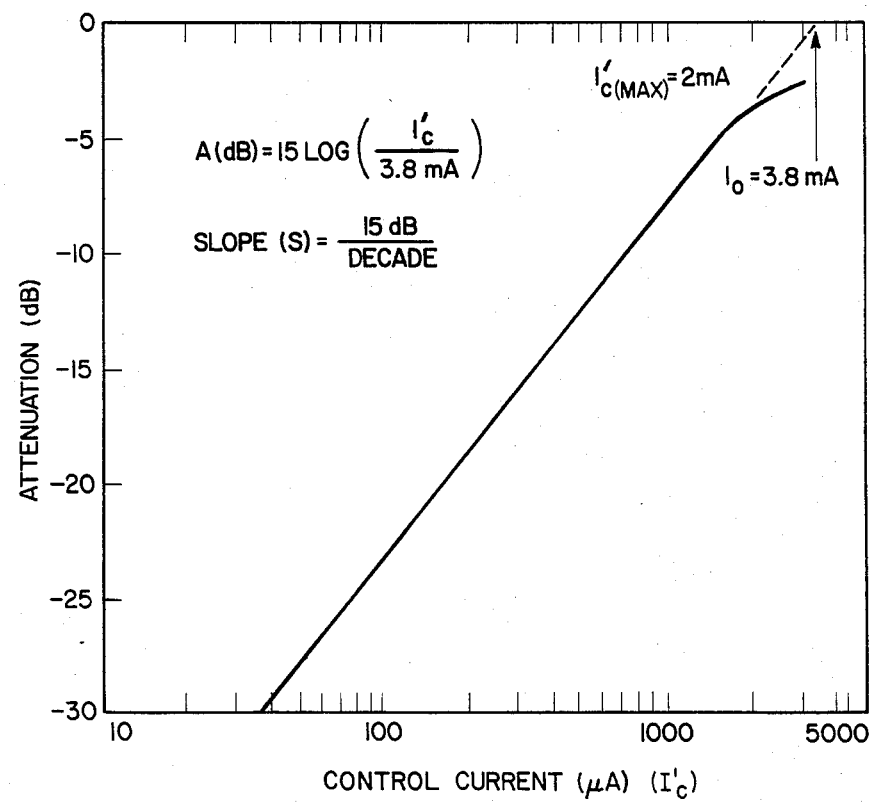
FIG. 2 illustrates a typical PIN diode's logarithmic attenuation characteristic.

The attenuation characteristic of PIN diode, 101, in decibels (db) is given by:

$$A = S \log (I_c'/I_o)$$

where
S = logarithmic slope in dB per decade
$I_c'$ = control current
$I_o$ = extrapolated control current equivalent to the diodes 0-dB attenuation (illustrated in FIG. 2 as 3.8 mA)

DAC, 102, a Precision Monolithic DAC-76, has a 4 milliamp (mA) maximum control current, $I_{c(MAX)}$, given by:

$$I_{c(MAX)} = 3.79 \, I_{REF}$$

where
$I_{REF}$ = reference or linear current, $1022 = V_{cc}/R_{REF}$
PIN Diode, 101 attenuation characteristic becomes $$A = 15 \log (I_c'/3.8 \text{ mA})$$

Because this attenuation is relatively linear for control currents as large as 2 mA, select $I_{c(MAX)}$ to be 2 mA, $R_{REF}$, 1024 is determined by:

$$R_{REF} = \frac{3.79 V_{cc}}{I_{c(MAX)}}$$

or $$R_{REF} = \frac{(3.79)(15)}{2mA}$$

$$R_{REF} = 28.4 \, K\Omega.$$

Referring again to FIG. 1, $R_{REF}$, 1024, is split and bypassed for filtering purposes. Additionally, for DC stability, any resistance from pin 12 to ground should have the same value as $R_{REF}$.

What is claimed is:

1. A digitally controlled linear radio frequency attenuator, comprising:
 a companding digital to analog converter having a digital input and an approximated exponential analog current sink output;
 a current inverter having an input effectively coupled to said exponential analog current sink output, and having an output which provides an output control current which is the inverse of the current appearing at the inverter input; and
 a PIN diode having a radio frequency input, a linearly attenuated radio frequency output, a control current input and a logarithmic radio frequency attenuation characteristic for use as a radio frequency attenuator, effectively coupled to said current inverter output;
 whereby a digital input signal to the companding digital to analog converter provides an approximated exponential current sink output which is inverted by the current inverter and provided to the PIN diode to control the logarithmic radio frequency attenuation characteristic to thereby linearly attenuate a radio frequency signal applied to the radio frequency input in response to the digital input to the companding digital to analog converter.

* * * * *